US012740006B2

(12) United States Patent
Zhang et al.

(10) Patent No.: US 12,740,006 B2
(45) Date of Patent: Sep. 15, 2026

(54) IMMERSION HEAT DISSIPATION SYSTEM HAVING TWO CIRCULATIONS AND HEAT DISSIPATION ASSEMBLY

(71) Applicant: Wistron Corporation, New Taipei City (TW)

(72) Inventors: Wen-Hua Zhang, New Taipei City (TW); Cheng-Ying Wu, New Taipei City (TW); Kuo-Hua Peng, New Taipei City (TW); Chien-Jung Chiu, New Taipei City (TW)

(73) Assignee: WISTRON CORPORATION, New Taipei City (TW)

( * ) Notice: Subject to any disclaimer, the term of this patent is extended or adjusted under 35 U.S.C. 154(b) by 160 days.

(21) Appl. No.: 18/443,518

(22) Filed: Feb. 16, 2024

(65) Prior Publication Data

US 2025/0081392 A1 Mar. 6, 2025

(30) Foreign Application Priority Data

Sep. 4, 2023 (TW) ................................ 112133549

(51) Int. Cl.
*H05K 7/20* (2006.01)

(52) U.S. Cl.
CPC ..... *H05K 7/20263* (2013.01); *H05K 7/20236* (2013.01); *H05K 7/20272* (2013.01)

(58) Field of Classification Search
CPC .... H01L 23/44; H05K 7/203; H05K 7/20281; H05K 7/2072; H05K 7/20263; H05K 7/20236
See application file for complete search history.

(56) References Cited

U.S. PATENT DOCUMENTS

2011/0049976 A1* 3/2011 Suzuki .................. H05K 7/203 307/9.1
2015/0062806 A1* 3/2015 Shelnutt ............ H05K 7/20318 361/679.53

(Continued)

FOREIGN PATENT DOCUMENTS

CN 108200753 A * 6/2018 ......... H05K 7/20763
CN 209489058 U 10/2019
TW I750733 B 12/2021

OTHER PUBLICATIONS

Examination report dated Mar. 19, 2024, listed in related Taiwan patent application No. 112133549.

(Continued)

*Primary Examiner* — Craig M Schneider
(74) *Attorney, Agent, or Firm* — McClure, Qualey & Rodack, LLP

(57) ABSTRACT

An immersion heat dissipation system having two circulations includes a tank body, a first working fluid, a liquid heat exchanger, a first circulation pipe unit, a first fluid driving unit, a gas transfer apparatus, a gas heat exchanger, a second circulation pipe unit, a second working fluid, and a second fluid driving unit. The tank body accommodates the first working fluid and the liquid heat exchanger immersed in the first working fluid. The first circulation pipe unit is in communication with the tank body to form a first circulation path. Through the second circulation pipe unit, the liquid heat exchanger is connected to the gas heat exchanger to form a second circulation path. The first working fluid and the second working fluid are driven by the first fluid driving unit and the second fluid driving unit, respectively, to flow toward the liquid heat exchanger for heat dissipation.

17 Claims, 12 Drawing Sheets

(56) References Cited

U.S. PATENT DOCUMENTS

| | | | | |
|---|---|---|---|---|
| 2015/0181762 | A1* | 6/2015 | Boyd | H05K 7/20236 165/104.33 |
| 2015/0351281 | A1* | 12/2015 | Campbell | H05K 7/20781 29/890.035 |
| 2019/0008077 | A1* | 1/2019 | Ishinabe | H05K 7/20736 |
| 2019/0219311 | A1* | 7/2019 | Smith | H05K 7/20236 |
| 2019/0255961 | A1* | 8/2019 | Heyne | B60L 53/302 |
| 2021/0007237 | A1* | 1/2021 | Onodera | H05K 7/20272 |
| 2021/0153392 | A1* | 5/2021 | Gao | H05K 7/20818 |
| 2022/0201902 | A1* | 6/2022 | Shaw | H05K 7/20836 |
| 2022/0264768 | A1* | 8/2022 | Horng | H05K 7/20327 |

OTHER PUBLICATIONS

"Application of heat pipe exchanger in immersion cooling technology;" pp. 1-10.

Cheng, C.C., et al.; "Design of a single-phase immersion cooling system through experimental and numerical analysis;" International Journal of Heat and Mass Transfer 160; Jul. 2020; pp. 1-12.

* cited by examiner

IMMERSION HEAT DISSIPATION SYSTEM HAVING TWO CIRCULATIONS AND HEAT DISSIPATION ASSEMBLY

CROSS-REFERENCE TO RELATED APPLICATION

This non-provisional application claims priority under 35 U.S.C. § 119(a) to Patent Application No. 112133549 filed in Taiwan, R.O.C. on Sep. 4, 2023, the entire contents of which are hereby incorporated by reference.

BACKGROUND

Technical Field

The present disclosure relates to a heat dissipation system, and in particular, to an immersion heat dissipation system having two circulations and a heat dissipation assembly.

Related Art

Since a server will generate a large amount of heat during operation, the server is equipped with an immersion heat dissipation system to take away the heat. However, the immersion heat dissipation system has a problem of limited heat dissipation efficiency. In addition, the immersion heat dissipation system may use dual-phase heat absorbing fluorine coolants, which have a non-zero global warming potential (GWP) value and thus cause environmental pollution. Moreover, since the dual-phase coolants usually require a space with high airtightness to achieve good heat exchange efficiency, high device costs are needed. Furthermore, alternatively, the single-phase heat absorbing non-conductive synthetic oil may be used in the immersion heat dissipation system. In accordance with safety regulations, a flash point of the non-conductive synthetic oil cannot be too low. However, non-conductive synthetic oil with a high flash point may have limited thermal conductivity efficiency.

SUMMARY

In view of the above problem, some embodiments of the present disclosure provide an immersion heat dissipation system having two circulations, and a heat dissipation assembly.

According to an embodiment, an immersion heat dissipation system having two circulations is adapted to accommodate an electronic device, and includes a tank body, a first circulation module, and a second circulation module. The tank body includes an accommodating structure. The first circulation module includes a first circulation pipe unit arranged on an outside of the tank body. The first circulation pipe unit is in communication with the accommodating structure. The second circulation module is arranged on the outside of the tank body and is configured to perform heat exchange on air outside the tank body. The second circulation module is in communication with the accommodating structure. The first circulation module and the second circulation module perform heat exchange on a liquid in the accommodating structure.

According to an embodiment, a heat dissipation assembly is adapted to accommodate a working fluid. The heat dissipation assembly includes a liquid heat exchanger, a gas heat exchanger, and a circulation pipe unit. The liquid heat exchanger is configured to perform heat exchange on a liquid. The gas heat exchanger is configured to perform heat exchange on air. The circulation pipe unit is adapted to accommodate the working fluid and is connected to the liquid heat exchanger and the gas heat exchanger.

BRIEF DESCRIPTION OF THE DRAWINGS

The instant disclosure will become more fully understood from the detailed description given herein below for illustration only, and thus not limitative of the instant disclosure, wherein.

DETAILED DESCRIPTION

Figure 1:
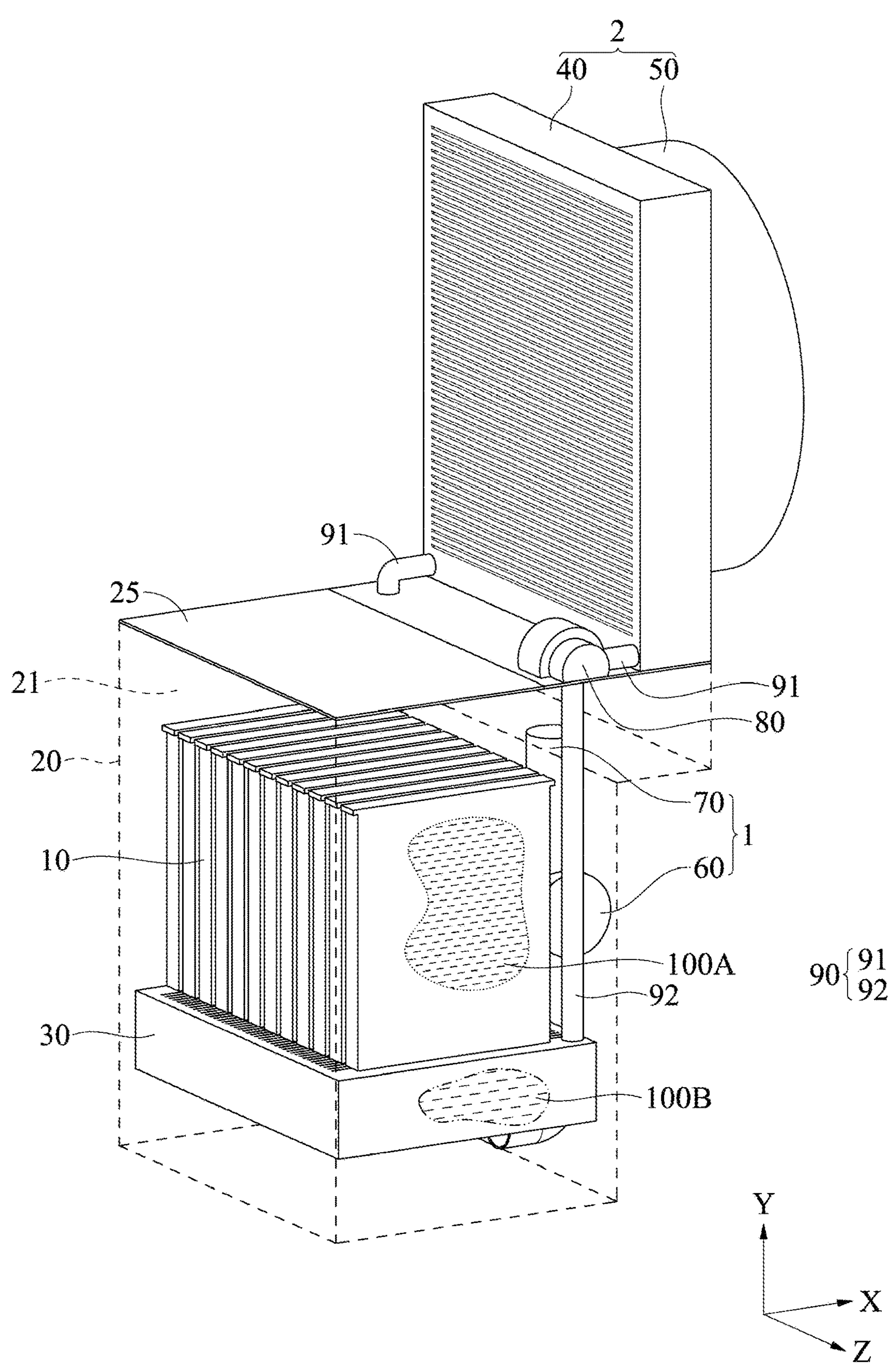
FIG. 1 illustrates a perspective view of an immersion heat dissipation system having two circulations according to some embodiments, in which a tank body is denoted by dashed lines; an upper cover is denoted by solid lines and is at a closed position; an imaginary circle denoted by dotted lines is shown to represent a partial first working fluid in the tank body from the perspective view; and an imaginary circle denoted by two-dotted chain lines is shown to represent a partial second working fluid in a liquid heat exchanger from the perspective view.
Figure 2:
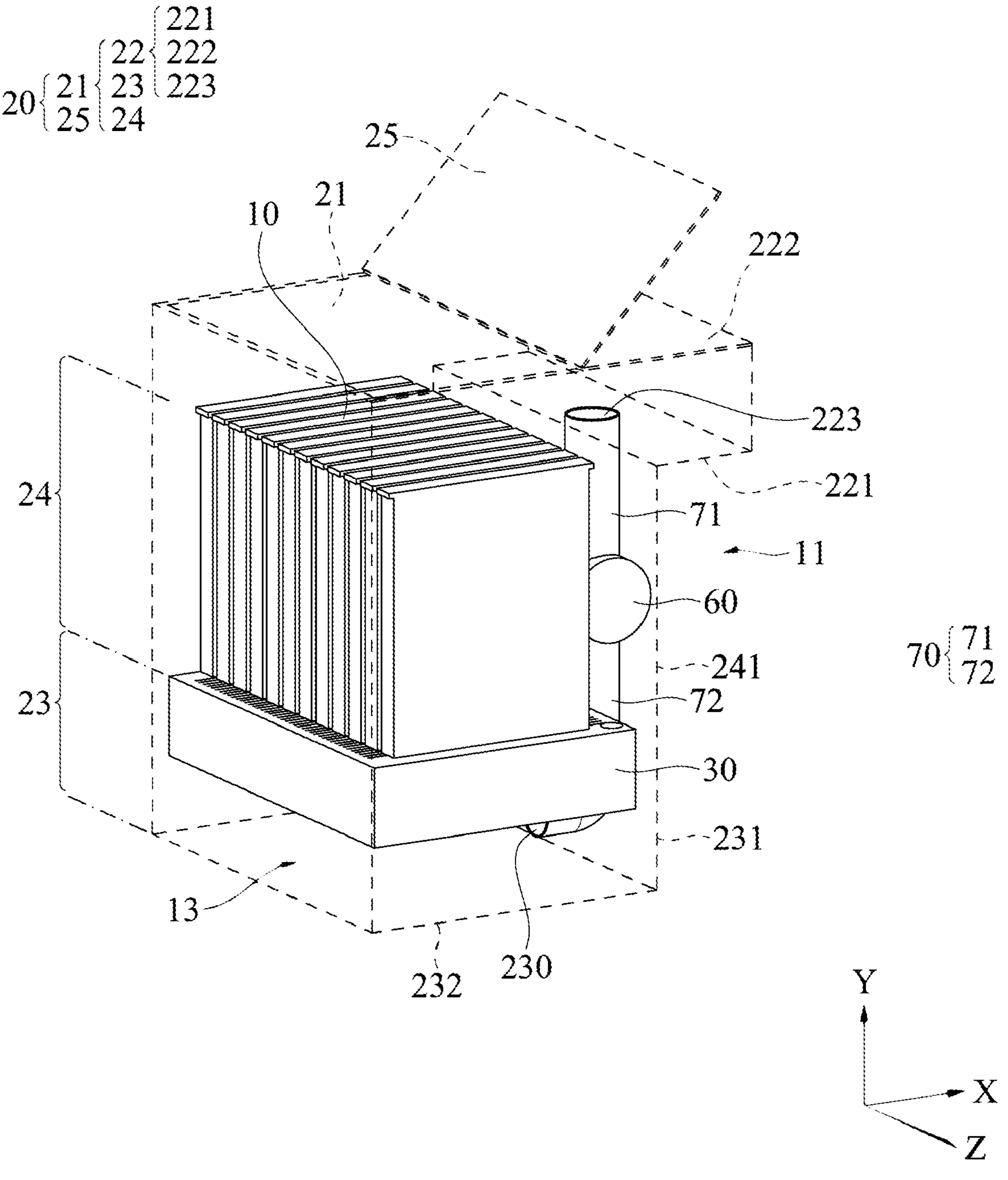
FIG. 2 illustrates a perspective view of the tank body according to some embodiments, in which the tank body is denoted by dashed lines; an upper cover is at an opened position; and a first working fluid and a second working fluid are not shown.

Please refer to FIG. 1 and FIG. 2. FIG. 1 illustrates a perspective view of an immersion heat dissipation system having two circulations according to some embodiments, in which a tank body 20 is denoted by dashed lines; an upper cover 25 is denoted by solid lines and is at a closed position; an imaginary circle denoted by dotted lines is shown to represent a partial first working fluid 100A in the tank body 20 from the perspective view; and an imaginary circle denoted by two-dotted chain lines is shown to represent a partial second working fluid 100B in a liquid heat exchanger 30 from the perspective view. FIG. 2 illustrates a perspective view of the tank body 20 according to some embodiments, in which the tank body 20 is denoted by dashed lines; an upper cover 25 is at an opened position; and a first working fluid 100A and a second working fluid 100B are not shown. The terms "connection" or "connect" in the following embodiments may be physical connections, or may be direct or indirect connections between physical elements.

In FIG. 1, the immersion heat dissipation system having two circulations is adapted to accommodate an electronic device 10, and the immersion heat dissipation system having two circulations includes the tank body 20, a first circulation module 1, and a second circulation module 2. The tank body 20 includes an accommodating structure 21. The first circulation module 1 includes a first circulation pipe unit 70 arranged on an outside of the tank body 20. The first circulation pipe unit 70 is in communication with the accommodating structure 21. The second circulation module 2 is arranged on the outside of the tank body 20 and is configured to perform heat exchange on air outside the tank body 20. The second circulation module 2 is in communication with the accommodating structure 21. The first circulation module 1 and the second circulation module 2 perform heat exchange on a liquid in the accommodating structure 21. In this way, in some embodiments, the first circulation module 1 and the second circulation module 2 perform heat exchange on the air and the liquid through circulation paths inside and outside of the tank body 20, thereby improving heat dissipation efficiency.

In some embodiments, the accommodating structure 21 may be an immersion tank of the immersion heat dissipation system, and the liquid in the accommodating structure 21 may be a coolant. In some embodiments, the first circulation module 1 is in communication with the accommodating structure 21, indicating that the liquid inside the accommodating structure 21 may flow to the first circulation pipe unit 70. In other words, in one or some embodiments, a portion of the liquid is in the tank body 20 and another portion of the liquid is out of the tank body 20. Such configuration provides improved heat dissipation efficiency. In some embodiments, a portion of the first circulation module 1 is out of the tank body 20, and another portion of the first circulation module is in the tank body 20. The portion out of the tank body 20 is in communication with the accommodating structure 21. In some embodiments, the portion of the first circulation module 1 outside the tank body 20 includes the first circulation pipe unit 70 in FIG. 1, and the portion of the first circulation module 1 inside the tank body 20 is a portion of the accommodating structure 21 immersed by the liquid (for example, the first working fluid 100A in FIG. 1). In some embodiments, the second circulation module 2 may be the gas heat exchanger 40 in FIG. 1, and the second circulation module 2 is in communication with the accommodating structure 21 through a pipe unit (for example, the second circulation pipe unit 90 in FIG. 1). In some embodiments, the second circulation module 2 may absorb heat from the liquid in the accommodating structure 21 of the first circulation module 1 and dissipate the absorbed heat into air, thereby achieving heat exchange on the liquid in the accommodating structure 21 performed by the first circulation module 1 and the second circulation module 2.

In addition, in FIG. 1, a heat dissipation assembly is adapted to accommodate the working fluid, and includes the liquid heat exchanger 30, the gas heat exchanger 40, and the second circulation pipe unit 90. The liquid heat exchanger 30 is configured to perform heat exchange on a liquid. The gas heat exchanger 40 is configured to perform heat exchange on air. The second circulation pipe unit 90 is adapted to accommodate the working fluid and is connected to the liquid heat exchanger 30 and the gas heat exchanger 40. That is, the working fluid flows in the liquid heat exchanger 30 and the gas heat exchanger 40, and the working fluid may flow in an independent circulation space. In this way, in some embodiments, the heat dissipation assembly may perform heat exchange on the air and the liquid, and thus the heat dissipation assembly has good heat exchange efficiency. Moreover, as known to the inventor, the immersion heat dissipation systems may be equipped with an ice water machine, a cooling water pipeline, and a cooling water distribution unit (CDU). However, these components occupy a large plane space, need high space costs, and are prone to have coolant leakage. As a result, short circuit issues of the electronic device are thus caused. Since the above heat dissipation assembly is adapted for the immersion heat dissipation system having two circulations, and the working fluid inside the heat dissipation assembly may flow in the independent circulation space, the heat dissipation assembly can reduce a risk of device damage due to leakage of the working fluid from the circulation space. Thus, the heat dissipation assembly with good reliability can be provided.

In some embodiments, the immersion heat dissipation system having two circulations achieves heat exchange on the air and the liquid through the heat dissipation assembly, thereby improving the heat dissipation efficiency.

Specifically, please refer to FIG. 1. In some embodiments, the immersion heat dissipation system having two circulations further includes the second circulation pipe unit 90 and the liquid heat exchanger 30. The liquid heat exchanger 30 is arranged in the accommodating structure 21. In addition, the second circulation module 2 includes the gas heat exchanger 40. The gas heat exchanger 40 is configured to perform heat exchange on the air outside the tank body 20. The second circulation pipe unit 90 is connected to the liquid heat exchanger 30 and the gas heat exchanger 40. The first circulation module 1 and the second circulation module 2 perform heat exchange in the accommodating structure 21 through the liquid heat exchanger 30. In some embodiments, the liquid heat exchanger 30 is immersed in the liquid in the accommodating structure 21. The liquid heat exchanger 30 absorbs heat of the liquid, and the heat absorbed by the liquid heat exchanger 30 is dissipated into the air through the gas heat exchanger 40. In some embodiments, the liquid heat exchanger 30 is arranged in the accommodating structure 21. The liquid heat exchanger 30 is configured to perform heat exchange on the liquid inside the accommodating structure 21. That is, the liquid heat exchanger 30 is immersed in the liquid inside the accommodating structure 21, and the liquid heat exchanger 30 can absorb the heat of the liquid. In some embodiments, the liquid heat exchanger 30 may be, but is not limited to, a fin-tube heat exchanger or an aluminum heat exchanger.

Please refer to FIG. 1. In some embodiments, the immersion heat dissipation system having two circulations further includes the electronic device 10 arranged in the accommodating structure 21. The electronic device 10 may be, but is not limited to, a server, a circuit board, a central processing unit, or a component that generates heat when performing a computational function. In some embodiments, the electronic device 10 is immersed in the liquid in the accommodating structure 21.

Please refer to FIG. 2. In some embodiments, the tank body 20 is configured to accommodate a coolant (for example, the first working fluid 100A in FIG. 1), and the tank body 20 includes the accommodating structure 21 and the upper cover 25. The accommodating structure 21 is arranged inside the tank body 20, and the upper cover 25 is pivotally connected to a side wall 222 of the accommodating structure 21 so as to be rotated between an opened position and a closed position. When the upper cover 25 is at the opened position, the interior of the accommodating structure 21 is exposed, as the upper cover 25 shown in FIG. 2. When the upper cover 25 is in the closed position, the interior of the accommodating structure 21 is sealed, as the upper cover 25 shown in FIG. 1. In this way, the operator can open or close the tank body 20 through upper cover 25 easily, in which convenience for the maintenance of the system can be provided. Moreover, the immersion heat dissipation system having two circulations is further adapted for a single-phase coolant, which has less airtightness requirements for the accommodating structure 21. Thus, in some embodiments, the immersion heat dissipation system having two circulations can achieve good heat exchange efficiency regardless of a specific type of the coolant.

Please refer to FIG. 2. In some embodiments, the accommodating structure 21 includes an extension portion 22, a bottom portion 23, and a heat source portion 24. The bottom portion 23 is connected to the extension portion 22 through the heat source portion 24, and the heat source portion 24 is between the bottom portion 23 and the extension portion 22. The extension portion 22 has an extended wall 221, the side wall 222, and an upper opening 223. The upper opening 223 is on the extended wall 221. The side wall 222 is pivotally connected to the upper cover 25. The bottom portion 23 includes a side wall 231, a bottom plate 232, and a lower opening 230. The lower opening 230 is on the side wall 231 of the bottom portion 23. A side wall 241 of the heat source portion 24 is connected to the extended wall 221 and the side wall 231 of the bottom portion 23 to form an outer side portion 11. In other words, in some embodiments, the outer side portion 11 is a space outside of the tank body 20.

Please refer to FIG. 2. In some embodiments, the first circulation pipe unit 70 is arranged on the outer side portion 11. The first circulation pipe unit 70 is in communication with the accommodating structure 21 to form a first circulation path. The first circulation pipe unit 70 includes an upper portion 71 and a lower portion 72. The upper portion 71 is connected to the upper opening 223 of the accommodating structure 21, and the lower portion 72 is connected to the lower opening 230 of the accommodating structure 21. In some embodiments, the first circulation module 1 includes the first circulation pipe unit 70 and a first fluid driving unit 60. The first circulation pipe unit 70 and the first fluid driving unit 60 are arranged on the outer side portion 11. The first fluid driving unit 60 is connected to the first circulation pipe unit 70. The first fluid driving unit 60 is configured to drive the liquid in the accommodating structure 21 (for example, the first working fluid 100A in FIG. 2) to flow toward the liquid heat exchanger 30. In some embodiments, two ends of the upper portion 71 of the first circulation pipe unit 70 are connected to the upper opening 223 and a water inlet of the first fluid driving unit 60, respectively. Two ends of the lower portion 72 of the first circulation pipe unit 70 are connected to an outlet of the first fluid driving unit 60 and the lower opening 230, respectively. The first circulation pipe unit 70 and the first fluid driving unit 60 are arranged in the outer side portion 11. In this way, in some embodiments, the simple pipeline configuration is provided, and an amount of liquid in the accommodating structure 21 can be minimized, in which benefits of saving space and reducing costs can be provided. In addition, since the first circulation pipe unit 70 and the first fluid driving unit 60 are out of the tank body 20, the heat dissipation efficiency can be improved.

Figure 3:
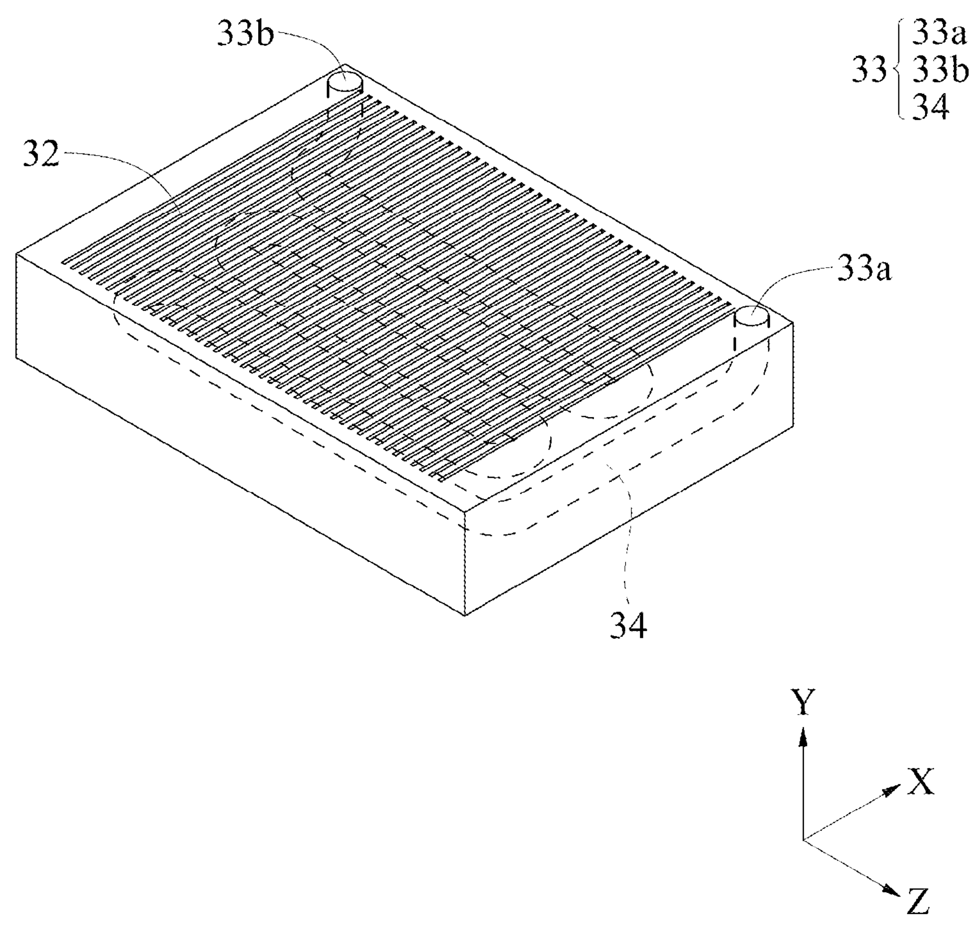
FIG. 3 illustrates a perspective view of a liquid heat exchanger according to some embodiments.
Figure 4:
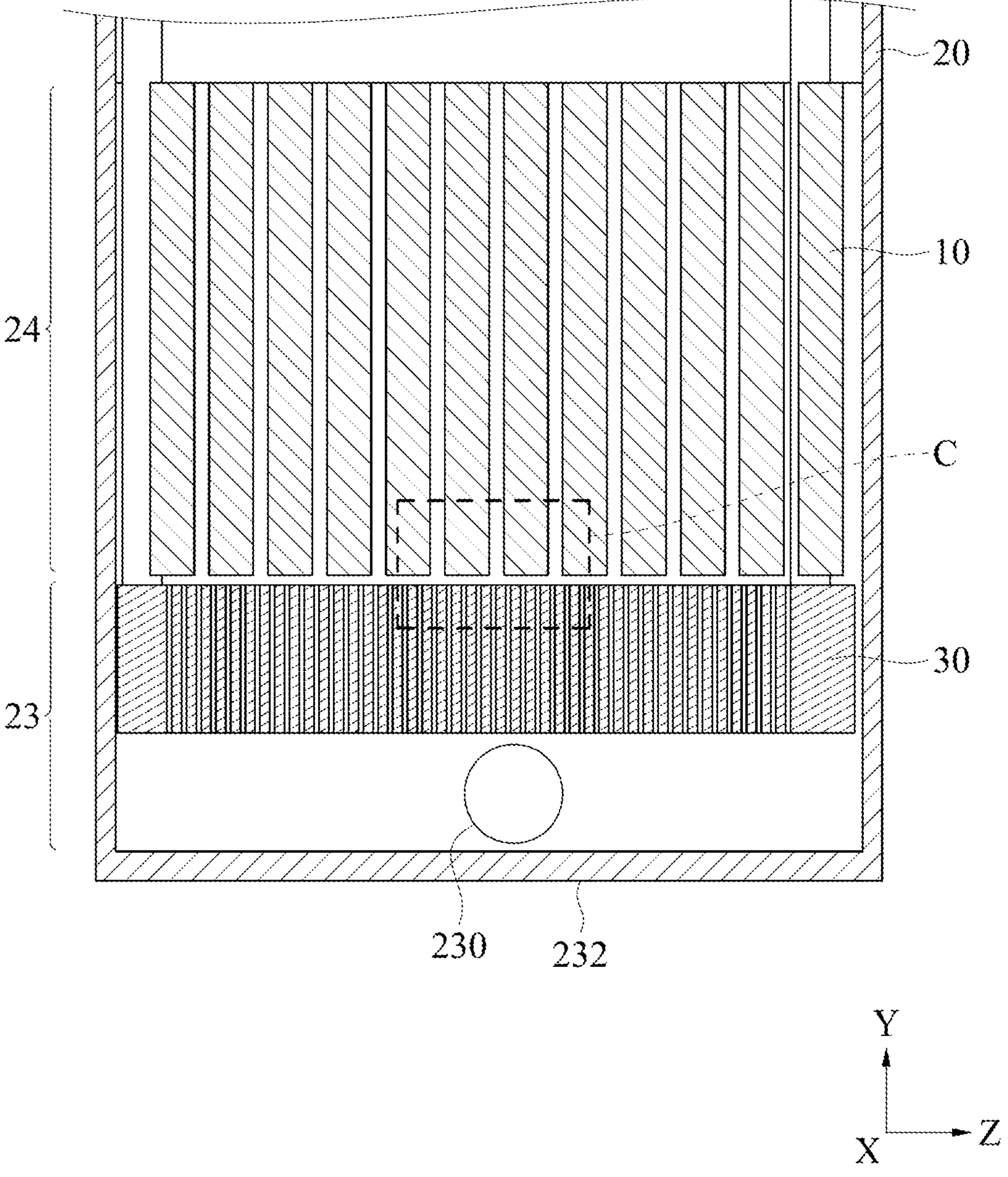
FIG. 4 illustrates a partial cross-sectional view along the +X axis direction according to the embodiment of FIG. 2, in which a first circulation pipe unit and a first fluid driving unit are not shown.
Figure 5:
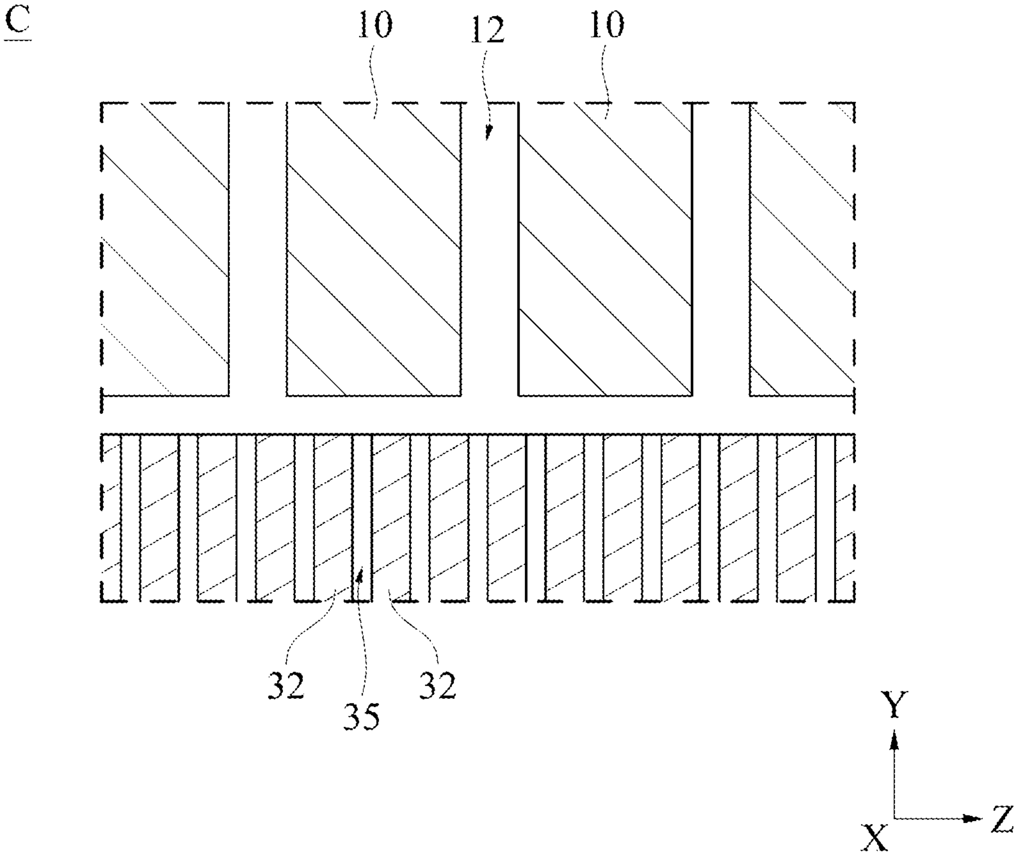
FIG. 5 illustrates an enlarged schematic view of the region C shown in FIG. 4.

Please refer to FIG. 3, FIG. 4, and FIG. 5. FIG. 3 illustrates a perspective view of a liquid heat exchanger 30 according to some embodiments. FIG. 4 illustrates a partial cross-sectional view along the +X axis direction according to the embodiment of FIG. 2, in which the first circulation pipe unit 70 and the first fluid driving unit 60 are not shown. FIG. 5 illustrates an enlarged schematic view of the region C shown in FIG. 4.

Please refer to FIG. 3. In some embodiments, the liquid heat exchanger 30 is adapted to accommodate a coolant. The liquid heat exchanger 30 includes a heat dissipation pipe unit 33 and a heat dissipation sheet 32. In this embodiment, the liquid heat exchanger 30 has a plurality of heat dissipation sheets 32. The heat dissipation pipe unit 33 includes a heat dissipation portion 34, an inlet portion 33*a*, and an outlet portion 33*b*. The heat dissipation portion 34 of the heat dissipation pipe unit 33 is configured to pass through a layered structure formed by the heat dissipation sheets 32. In this way, in some embodiments, the coolant inside the liquid heat exchanger 30 may flow to the heat dissipation portion 34 through the inlet portion 33*a* of the heat dissipation pipe unit 33. In the heat dissipation portion 34, the coolant performs heat exchange on the liquid in the accommodating structure 21, and the coolant in the heat dissipation portion 34 absorbs the heat of the liquid. In some embodiments, the coolant is the second working fluid 100B, and the liquid in the accommodating structure 21 is the first working fluid 100A, as shown in FIG. 1.

Figure 7:
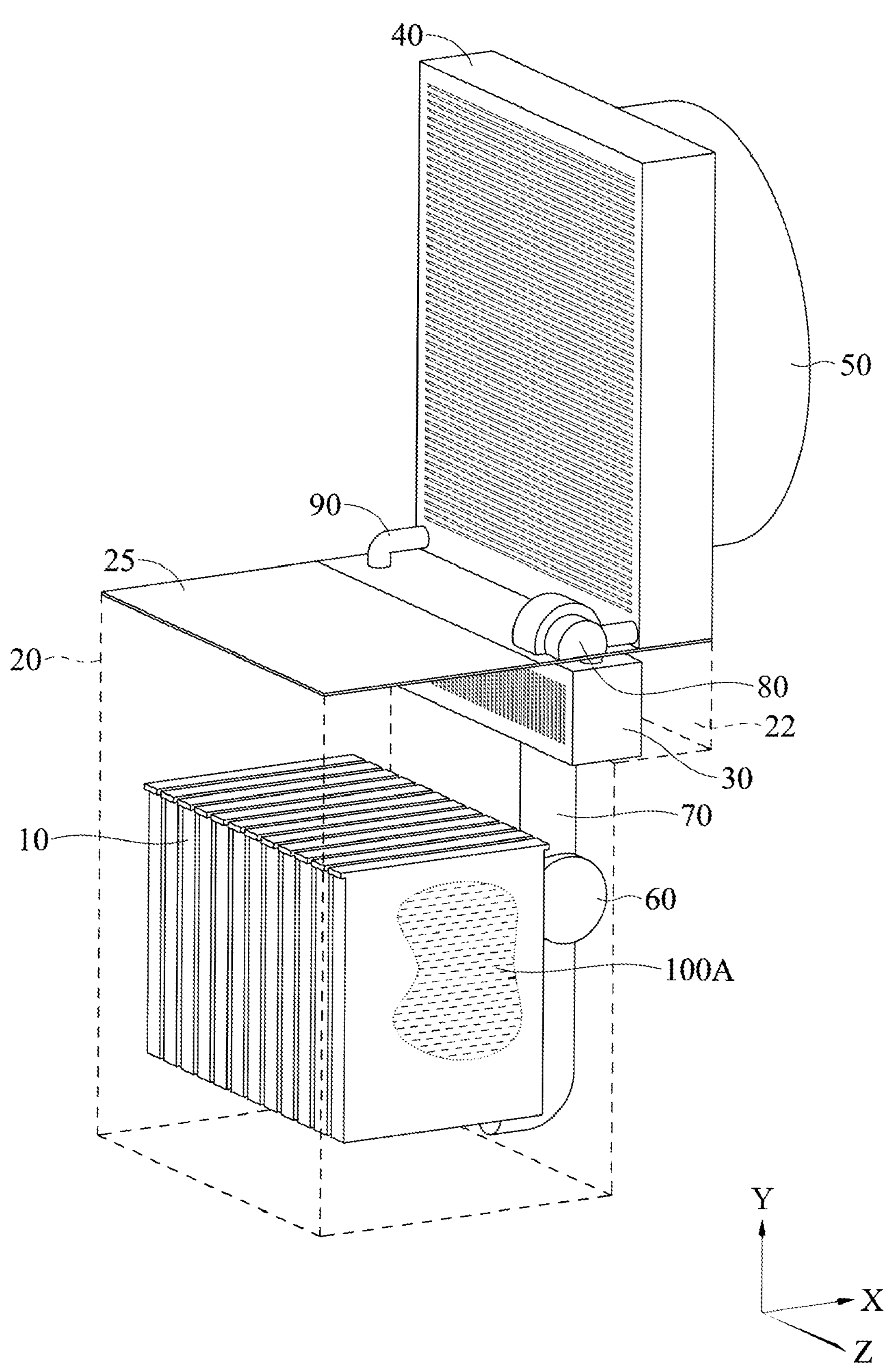
FIG. 7 illustrates a perspective view of the immersion heat dissipation system having two circulations according to some embodiments, in which the tank body is denoted by dashed lines; an upper cover is denoted by solid lines; an imaginary circle denoted by dotted lines is shown to represent a partial first working fluid in the tank body from the perspective view; and a second working fluid is not shown.

Please refer to FIG. 4, FIG. 5, and FIG. 7. FIG. 7 illustrates a perspective view of the immersion heat dissipation system having two circulations according to some embodiments, in which the tank body 20 is denoted by dashed lines; an upper cover 25 is denoted by solid lines; an imaginary circle denoted by dotted lines is shown to represent a partial first working fluid 100A in the tank body 20 from the perspective view; and the second working fluid 100B is not shown.

Please refer to FIG. 4 and FIG. 5. In some embodiments, the liquid heat exchanger 30 is arranged on the bottom portion 23. In this embodiment, the immersion heat dissipation system having two circulations is adopted to a plurality of electronic devices 10. The electronic devices 10 are arranged in parallel on the heat source portion 24, as shown in FIG. 4. Specifically, in FIG. 5, two adjacent electronic devices 10 form a slit channel 12, two adjacent heat dissipation sheets 32 form a splitting flow channel 35, and the slit channel 12 is in communication with the splitting flow channel 35. In this way, in some embodiments, the liquid in the accommodating structure 21 may flow in the slit channel 12 and the splitting flow channel 35. In some embodiments, the liquid in the accommodating structure 21 flows from the splitting flow channel 35 toward the slit channel 12 (the flowing direction of the liquid is the +Y axis direction in FIG. 5). Thus, the heat dissipation sheets 32 of the liquid heat exchanger 30 can evenly distribute liquid flows to the electronic devices 10, so that the flow field where the electronics device 10 is immersed tends to be uniform.

Please refer to FIG. 2. In some embodiments, the liquid heat exchanger 30 is arranged on the bottom portion 23 of the accommodating structure 21. The liquid heat exchanger 30 and the bottom plate 232 of the bottom portion 23 form a tank bottom 13, and the lower opening 230 faces the tank bottom 13, as shown in FIG. 2. Please refer to FIG. 7. In some embodiments, the liquid heat exchanger 30 is arranged on the extension portion 22 of the accommodating structure 21, and the plurality of heat dissipation sheets 32 of the liquid heat exchanger 30 are arranged in parallel along the Y axis in FIG. 7. Since the liquid heat exchanger 30 may be arranged close to the upper cover 25 of the tank body 20, the operator can assemble the liquid heat exchanger 30 and perform the maintenance of the liquid heat exchanger 30 conveniently.

In some embodiments, a plurality of liquid heat exchangers 30 may be arranged in the immersion heat dissipation system having two circulations, and the liquid heat exchangers are respectively arranged on the extension portion 22 (shown in FIG. 7) and bottom portion 23 (shown in FIG. 2) of the accommodating structure 21. Due to the increase in the number of heat dissipation sheets 32 of the liquid heat exchangers 30, the contact area between the liquid heat exchangers 30 and the liquid in the accommodating structure 21 increases, so that the heat exchange efficiency of the liquid in the accommodating structure 21 is improved. In this way, the temperature inside the tank may be stably maintained at a low temperature.

Please refer to FIG. 1. In some embodiments, the immersion heat dissipation system having two circulations further includes the first working fluid 100A. The first working fluid 100A may flow in the accommodating structure 21, the first circulation pipe unit 70, and the first fluid driving unit 60. The first fluid driving unit 60 is configured to drive the first working fluid 100A to flow toward the liquid heat exchanger 30. The liquid heat exchanger 30 is configured to perform heat exchange on the first working fluid 100A. In some embodiments, the first working fluid 100A may be a non-conductive working fluid, such as a non-conductive synthetic oil, a polymer alpha olefin (PAO) coolant, a gas to liquid base oil (GTL) coolant, a synthetic ester coolant, a fluorocarbon coolant, or the like. In some embodiments, the first working fluid 100A may be a single-phase coolant or a dual-phase coolant. In some embodiments, the first working fluid 100A is a single-phase coolant.

Figure 6:
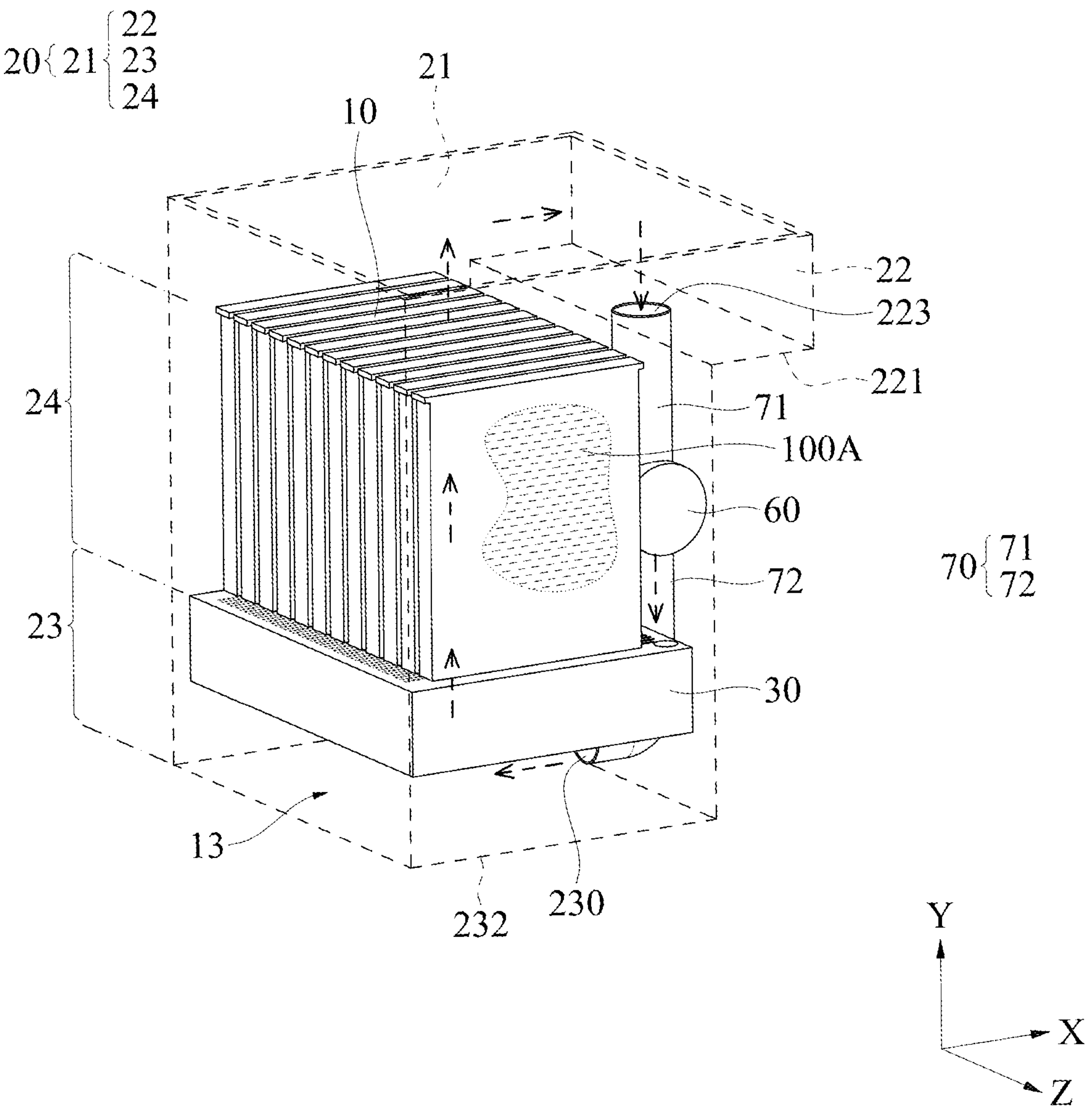
FIG. 6 illustrates a perspective view of the tank body according to some embodiments, in which the tank body is denoted by dashed lines; an imaginary circle denoted by dotted lines is shown to represent a partial first working fluid in the tank body from the perspective view; and a flowing direction of the first working fluid in a first circulation path is represented by an arrow.

Please refer to FIG. 6. FIG. 6 illustrates a perspective view of the tank body 20 according to some embodiments, in which the tank body 20 is denoted by dashed lines; an imaginary circle denoted by dotted lines is shown to represent a partial first working fluid 100A in the tank body 20 from the perspective view; and a flowing direction of the first working fluid 100A in the first circulation path is represented by an arrow.

Please refer to FIG. 6. In some embodiments, the first working fluid 100A is in the first circulation path. In other words, the first working fluid 100A is driven by the first fluid driving unit 60 to flow in the accommodating structure 21, the first circulation pipe unit 70, and the first fluid driving unit 60. The electronic device 10 is immersed in the first working fluid 100A. The first working fluid 100A is a single-phase coolant and absorbs heat of the electronic device 10 as a stationary phase. The liquid level of the first working fluid 100A is higher than the extended wall 221 so that the first working fluid 100A may flow into the first circulation pipe unit 70 through the upper opening 223. Specifically, in some embodiments, since the first fluid driving unit 60 drives the first working fluid 100A to flow, negative pressure is generated at the upper portion 71 of the first circulation pipe unit 70. Therefore, the first working fluid 100A flows into the first circulation pipe unit 70 through the upper opening 223 of the accommodating structure 21 driven by a suction force, and then the first working fluid 100A flows back to the accommodating structure 21 through the lower opening 230 toward the liquid heat exchanger 30. The flowing direction of the first working fluid 100A is shown as the arrow direction in FIG. 6. In this way, in some embodiments, an active heat dissipation cycle can be provided. For example, due to the heat absorption from the electronic device 10, the temperature of the first working fluid 100A in the heat source portion 24 of the accommodating structure 21 becomes $T_{a1}$, that is, the temperature of the first working fluid 100A at the top (that is, the portion of the first working fluid 100A close to the extension portion 22) of the electronic device 10 is the temperature $T_{a1}$. The first working fluid 100A with the temperature $T_{a1}$ is driven by the first fluid driving unit 60 to flow into the first circulation pipe unit 70 along the arrow direction shown in FIG. 6, and the first working fluid 100A flows into the tank bottom 13 of the bottom portion 23 through the lower opening 230, and then the first working fluid 100A successively flows through the liquid heat exchanger 30 and the electronic device 10 along the +Y axis direction in FIG. 6. In other words, the first working fluid 100A at the heat source portion 24 absorbs the heat generated by the electronic device 10 and is driven by the first fluid driving unit 60 to flow toward the liquid heat exchanger 30. Then, the liquid heat exchanger 30 absorbs the heat of the first working fluid 100A, so that the temperature of the first working fluid 100A is reduced. The temperature of the first working fluid 100A on a side of the liquid heat exchanger 30 close to the electronic device 10 is $T_{a2}$, which is less than the temperature $T_{a1}$. The first working fluid 100A with the temperature $T_{a2}$ then flows toward the electronic device 10 along the +Y axis direction in FIG. 6 to absorb the heat generated by the electronic device 10, and the first working fluid 100A thus proceeds to a next heat dissipation cycle. Please refer to FIG. 7. In some embodiments, the liquid heat exchanger 30 is arranged on the extension portion 22 of the accommodating structure 21. The first working fluid 100A flows out of the liquid heat exchanger 30 in the +X axis direction shown in FIG. 7 from the side of the liquid heat exchanger 30 close to the electronic device 10, and then the first working fluid 100A flows into the first circulation pipe unit 70. As described in the above embodiment, the first working fluid 100A absorbs the heat generated by the electronic device 10 and thus the temperature of the first working fluid 100A becomes $T_{a1}$, and the temperature $T_{a1}$ of the first working fluid 100A may be reduced to $T_{a2}$ through the liquid heat exchanger 30. In this way, the first working fluid 100A performs the active heat dissipation cycle in the first circulation path. As known to the inventor, compared with a first working fluid 100A performing the passive heat dissipation cycle (which indicates that the heat dissipation of the electronic device 10 is achieved by applying the physical properties of the first working fluid 100A), the first working fluid 100A that performs the active heat dissipation cycle can maintain the temperature inside the accommodating structure 21 more effectively.

Furthermore, please refer to FIG. 6. In some embodiments, the first fluid driving unit 60 is configured to drive the first working fluid 100A to flow with a liquid mass flow rate in response to the temperature of the first working fluid 100A. That is, the liquid mass flow rate of the first working fluid 100A provided by the first fluid driving unit 60 may be adjusted based on the temperature of the first working fluid 100A. A relationship between the liquid mass flow rate provided by the first fluid driving unit 60 and the temperature inside the accommodating structure 21 is represented by a formula (1). In some embodiments, the liquid mass flow rate is a volume of the first working fluid 100A flowing through the liquid heat exchanger 30 per unit time.

$$\dot{m}_1 = Q_{in} / C_{p,f1}\ (T_{f1} - T_e) \qquad \text{Formula (1)}$$

In the formula (1), $\dot{m}_1$ is the liquid mass flow rate provided by the first fluid driving unit 60, $T_{f1}$ is an average temperature of the first working fluid 100A, $T_e$ is an average temperature of the electronic device 10, $C_{p,f1}$ is a specific heat capacity of the first working fluid 100A, and $Q_{in}$ is heat generated by the electronic device 10, which may be measured through a monitoring module of the electronic device 10, or may be calculated by using a heat calculation formula (reference equations (1.1) and (1.2)) recorded by Chin-Chi Cheng et al. in "Design of a single-phase immersion cooling system through experimental and numerical analysis", International Journal of Heat and Mass Transfer, 160 (2020).

$$Q = \rho C_p(\partial T / \partial t) + \rho C_p u \cdot \nabla T + \nabla \cdot q \qquad \text{Formula (1.1)}$$

$$q = -k\nabla T \qquad \text{Formula (1.2)}$$

In the formulas (1.1) and (1.2), Q is heat (in a unit of watt (W)) of the heating source, $C_p$ is a heat capacity, T is a temperature, q is a heat flux, and k is a heat transfer coefficient.

For example, in FIG. 6, the temperature of the first working fluid 100A becomes $T_{a1}$ due to the heat absorption from the electronic device 10. When the temperature $T_{a1}$ exceeds a temperature upper limit, the first fluid driving unit 60 increases the liquid mass flow rate, so that $\dot{m}_1$ in the formula (1) increases. Since $Q_{in}$ and $C_{p,f1}$ in the formula (1) are fixed values, when $\dot{m}_1$ is increased, a temperature difference (that is, $T_{f1}-T_e$) decreases, so that the electronic device 10 and the first working fluid 100A reach thermal equilibrium. In other words, after $\dot{m}_1$ is increased, the difference between the average temperature of the first working fluid 100A and the average temperature of the electronic device 10 decreases. The increase in the liquid mass flow rate may reduce a thermal equilibrium temperature of the electronic device 10 and the first working fluid 100A, thereby maintaining the electronic device 10 at a low temperature. In some embodiments, the first fluid driving unit 60 may reduce the liquid mass flow rate in response to the average temperature of the first working fluid 100A reaching a temperature lower limit. In some embodiments, the first fluid driving unit 60 may adjust the liquid mass flow rate based on the temperatures of the first working fluid 100A at different positions in the first circulation path. For example, when a difference between the temperature of the first working fluid 100A at the extension portion 22 and the temperature of the first working fluid 100A at the bottom portion 23 exceeds a set value, it indicates that the electronic device 10 and the first working fluid 100A do not reach thermal equilibrium. In this case, the first fluid driving unit 60 increases the liquid mass flow rate of the first working fluid 100A to facilitate thermal equilibrium between the electronic device 10 and the first working fluid 100A. In some embodiments, the temperature of the first working fluid 100A which the first fluid driving unit 60 responds to may be a temperature of a certain position within the accommodating structure 21, a temperature difference between different positions within the accommodating structure 21, the average temperature of the first working fluid 100A, or any combination of the above. Thus, the first fluid driving unit 60 may adjust the liquid mass flow rate based on the temperature of the first working fluid 100A. The heat exchange efficiency of the first working fluid 100A may be improved through increase of the liquid mass flow rate, and energy-saving operation may be achieved through reduction of the liquid mass flow rate.

Figure 8:
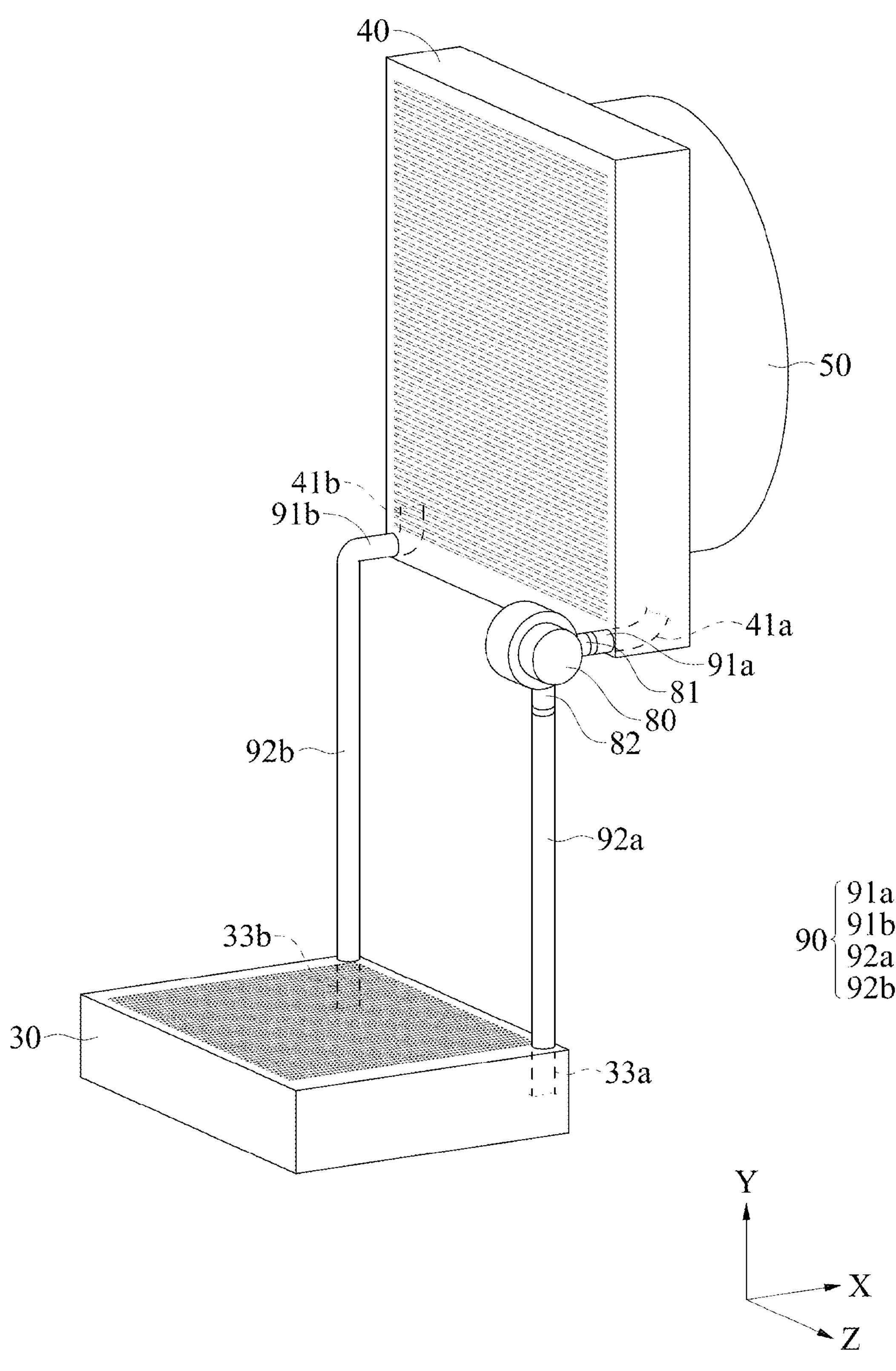
FIG. 8 illustrates a perspective view of a liquid heat exchanger, a gas heat exchanger, a second circulation pipe unit, a second fluid driving unit, and a gas transfer apparatus according to some embodiments.
Figure 9:
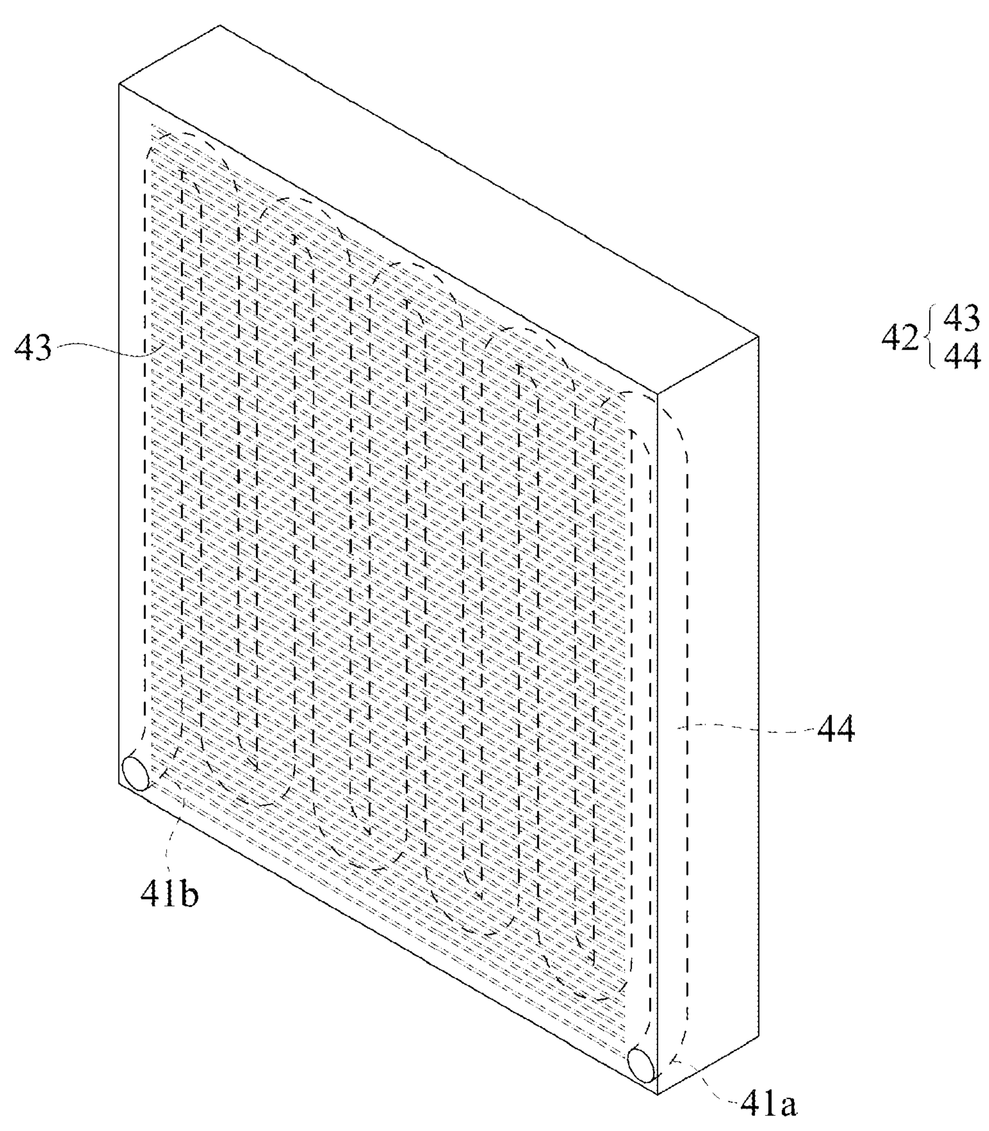
FIG. 9 illustrates a perspective view of a gas heat exchanger according to some embodiments.
Figure 9:
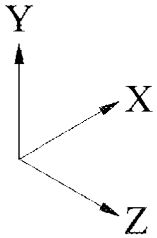
Figure 10:
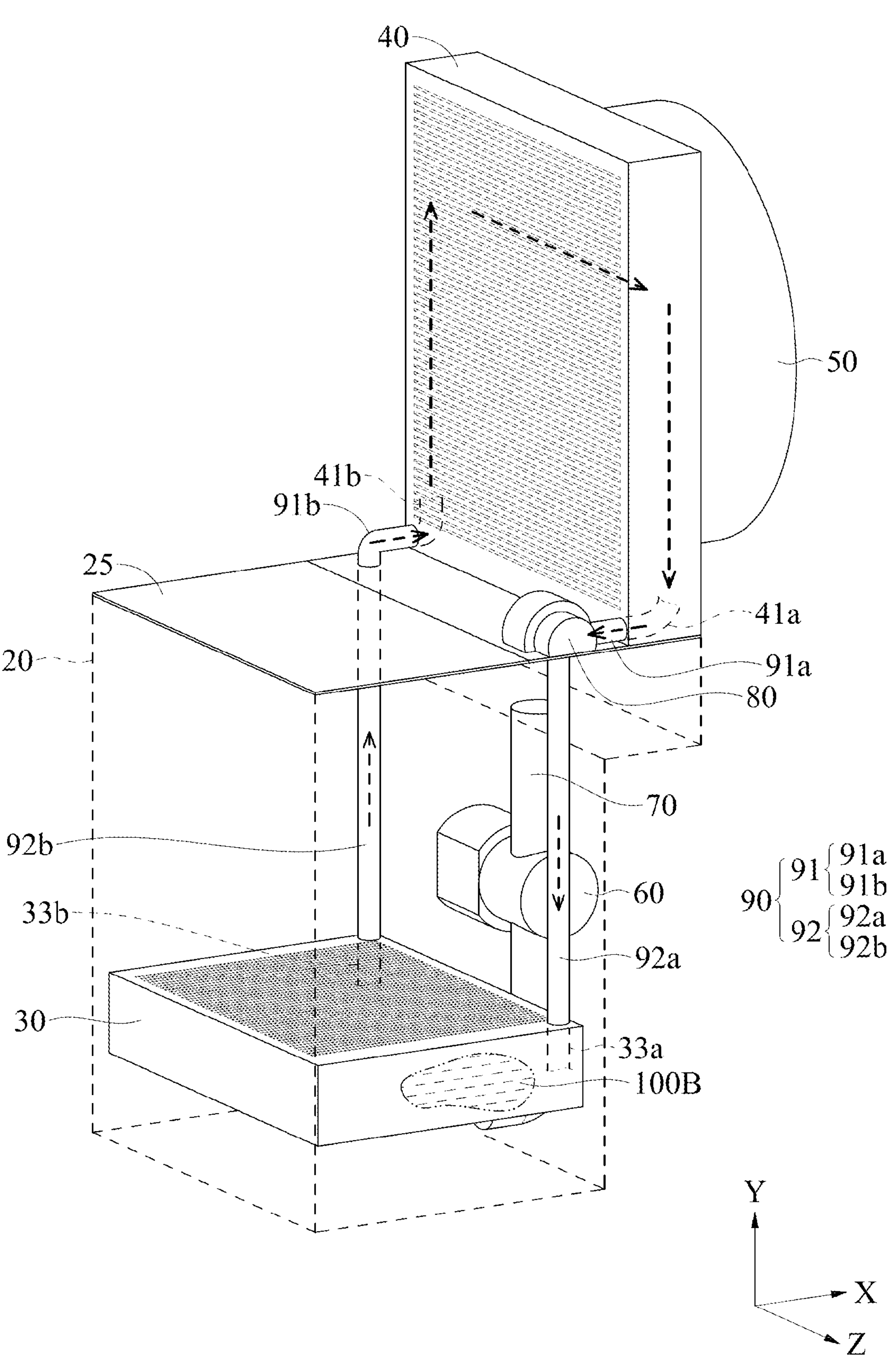
FIG. 10 illustrates a perspective view of the immersion heat dissipation system having two circulations according to some embodiments, in which the tank body is denoted by dashed lines; an upper cover is denoted by solid lines; an imaginary circle denoted by two-dotted chain lines is shown to represent a partial second working fluid in a liquid heat exchanger from the perspective view; a flowing direction of the second working fluid in a second circulation path is shown by an arrow; and a first working fluid and an electronic device are not shown.

Please refer to FIG. 1, FIG. 8, FIG. 9, and FIG. 10. FIG. 8 illustrates a perspective view of a liquid heat exchanger 30, a gas heat exchanger 40, a second circulation pipe unit 90, a second fluid driving unit 80, and a gas transfer apparatus 50 according to some embodiments. FIG. 9 illustrates a perspective view of a gas heat exchanger 40 according to some embodiments. FIG. 10 illustrates a perspective view of the immersion heat dissipation system having two circulations according to some embodiments, in which the tank body 20 is denoted by dashed lines; an upper cover 25 is denoted by solid lines; an imaginary circle denoted by two-dotted chain lines is shown to represent a partial second working fluid 100B in a liquid heat exchanger 30 from the perspective view; a flowing direction of the second working fluid 100B in a second circulation path is shown by an arrow; and a first working fluid 100A and an electronic device 10 are not shown.

Please refer to FIG. 1. In some embodiments, the gas heat exchanger 40 is arranged on the outside of the tank body 20. The gas heat exchanger 40 is configured to perform heat exchange on the air outside the tank body 20. In other words, the air outside the tank body absorbs the heat of the gas heat exchanger 40. The gas heat exchanger 40 may be, but is not limited to, a fin-tube heat exchanger or an aluminum heat exchanger.

Please refer to FIG. 9. In some embodiments, the gas heat exchanger 40 includes a cooling portion 41*a*, a high-temperature portion 41*b*, and a condensation portion 42. The condensation portion 42 is connected to the cooling portion 41*a* and the high-temperature portion 41*b*. The condensation portion 42 has a condensation pipe 44 and a fin 43. In this embodiment, the condensation portion 42 has a plurality of fins 43. In some embodiments, the condensation pipe 44 is configured to pass through a layered structure formed by the fins 43. The two adjacent fins 43 are arranged in parallel to form an airflow channel. In this way, the air outside the tank body 20 may be driven to flow along the airflow channel. In addition, please refer to FIG. 9. In some embodiments, the fins 43 are horizontally arranged; that is, the fins 43 are arranged horizontally along the Z axis direction in FIG. 9 and extend in the X axis direction in FIG. 9, and the fins 43 are parallel to each other. In some embodiments, the fins 43 are vertically arranged. For example, the configuration of the fins 43 in FIG. 9 is rotated by 90 degrees. That is, the fins are arranged vertically along the Y axis direction in FIG. 9 and extend in the X-axis direction in FIG. 9, and the fins 43 are parallel to each other.

Please refer to FIG. 8. In some embodiments, the second circulation pipe unit 90 is connected to the liquid heat exchanger 30 and the gas heat exchanger 40 to form a second circulation path. Please refer to FIG. 10. In some embodiments, the second circulation pipe unit 90 includes an immersed portion 92 and a turning portion 91. The turning portion 91 is arranged on the outside of the tank body 20. The immersed portion 92 is arranged in the accommodating structure 21. The second fluid driving unit 80 is arranged on the outside of the tank body 20 and is connected to the second circulation pipe unit 90.

Specifically, please refer to FIG. 8. In some embodiments, the immersed portion 92 includes a first immersed portion 92*a* and a second immersed portion 92*b*. The turning portion 91 includes a first turning portion 91*a* and a second turning portion 91*b*. Two ends of the first immersed portion 92*a* are respectively connected to the inlet portion 33*a* of the liquid heat exchanger 30 and an outlet 82 of the second fluid driving unit 80. Two ends of the first turning portion 91*a* are respectively connected to an inlet 81 of the second fluid driving unit 80 and the cooling portion 41*a* of the gas heat exchanger 40. Two ends of the second immersed portion 92*b* are respectively connected to the outlet portion 33*b* of the liquid heat exchanger 30 and the second turning portion 91*b*. Two ends of the second turning portion 91*b* are respectively connected to the second immersed portion 92*b* and the high-temperature portion 41*b* of the gas heat exchanger 40.

Please refer to FIG. 1 and FIG. 10. In some embodiments, the immersion heat dissipation system having two circulations further includes the second working fluid 100B, and the second working fluid 100B is in the second circulation pipe unit 90 and may flow between the liquid heat exchanger 30 and the gas heat exchanger 40. In some embodiments, the second working fluid 100B may be a non-conductive working fluid, such as a non-conductive synthetic oil, a PAO coolant, a GTL coolant, a synthetic ester coolant, a fluorocarbon coolant, or the like. In some embodiments, the second working fluid 100B may be a single-phase coolant or a dual-phase coolant. In some embodiments, the second working fluid 100B is a dual-phase coolant. In some embodiments, the second working fluid 100B absorbs the heat of the first working fluid 100A as a varying phase. For example, in FIG. 1, the second working fluid 100B in a liquid state absorbs the heat of the first working fluid 100A at the liquid heat exchanger 30 and becomes in a gas state. The second working fluid 100B in the gas state flows into the gas heat exchanger 40 along the second circulation pipe unit 90. In the gas heat exchanger 40, the second working fluid 100B in the gas state is condensed into a liquid state. The second working fluid 100B condensed into the liquid state is driven by the second fluid driving unit 80 to flow from the gas heat exchanger 40 toward the liquid heat exchanger 30.

Please refer to FIG. 1. In some embodiments, the immersion heat dissipation system having two circulations is adapted for the first working fluid 100A and the second working fluid 100B. The first working fluid 100A is in the accommodating structure 21 of the tank body 20 and may flow to the first circulation pipe unit 70. The second working fluid 100B is in the liquid heat exchanger 30 and may flow to the gas heat exchanger 40 through the second circulation pipe unit 90. The two working fluids flow in their independent circulation spaces, respective. In some embodiments, both the first working fluid 100A and the second working fluid 100B are non-conductive synthetic oils, and a flash point of the first working fluid 100A is greater than or equal to a flash point of the second working fluid 100B. In some embodiments, the first working fluid 100A and the second working fluid 100B may be single-phase coolants or dual-phase coolants. In some embodiments, the first working fluid 100A is a single-phase coolant, and the second working fluid 100B is a dual-phase coolant.

Please refer to FIG. 10. In some embodiments, the second working fluid 100B flow in the second circulation path, and the second fluid driving unit 80 is configured to drive the second working fluid 100B to flow toward the liquid heat exchanger 30. Specifically, in FIG. 10, in some embodiments, since the second fluid driving unit 80 drives the second working fluid 100B to flow, negative pressure is generated at the first turning portion 91*a* of the second circulation pipe unit 90. Therefore, the second working fluid 100B is suctioned into the first turning portion 91*a* of the second circulation pipe unit 90 from the cooling portion 41*a* of the gas heat exchanger 40, and then the second working fluid 100B flows into the heat dissipation portion 34 of the liquid heat exchanger 30 through the inlet portion 33*a* of the liquid heat exchanger 30 (as shown in FIG. 3). The second working fluid 100B in the liquid heat exchanger 30 absorbs the heat of the first working fluid 100A (as shown in FIG. 1) and then flows into the high-temperature portion 41*b* of the gas heat exchanger 40 along the second immersed portion 92*b* through the outlet portion 33*b* of the liquid heat exchanger 30. The heat of the second working fluid 100B flowing into the condensation pipe 44 (as shown in FIG. 9) of the gas heat exchanger 40 is dissipated into the air. In this way, an active heat dissipation cycle is provided. The flowing direction of the second working fluid 100B in the second circulation path is substantially shown by an arrow in FIG. 10. In this way, in some embodiments, the immersion heat dissipation system having two circulations is adapted for two working fluids, which work in the first circulation path and the second circulation path, respectively. Thus, the immersion heat dissipation system having two circulations with good reliability can be provided. In addition, since the configuration of the two active heat dissipation cycles is consisting of the gas heat exchanger 40 and the liquid heat exchanger 30, the immersion heat dissipation system having two circulations can effectively utilize a heat dissipation capacity of unit area, so to provide good space utilization. Moreover, the overall pipeline configuration of the immersion heat dissipation system having two circulations is adapted for various heat dissipation systems, so that no additional costs are spent to rearrange the pipeline. Thus, the immersion heat dissipation system having two circulations with economic benefits can be provided.

Please refer to FIG. 10. In some embodiments, the second fluid driving unit 80 is configured to drive the second working fluid 100B to flow with a flow rate in response to a temperature of the second working fluid 100B. For example, the temperature of the second working fluid 100B becomes $T_{b1}$ due to the heat absorption from the first working fluid 100A. When the temperature $T_{b1}$ exceeds a temperature upper limit, the second fluid driving unit 80 increases the flow rate of the second working fluid 100B. That is, due to the increase in the flow rate of the second working fluid 100B, in a unit time, a larger volume of second working fluid 100B flows through the liquid heat exchanger 30 to absorb the heat of the first working fluid 100A. Therefore, the heat exchange efficiency of the liquid heat exchanger 30 is improved, thereby maintaining the first working fluid 100A in a stable low-temperature state. In some embodiments, the second fluid driving unit 80 may reduce the flow rate in response to an average temperature of the second working fluid 100B reaching a temperature lower limit. In some embodiments, the second fluid driving unit 80 may adjust the flow rate based on the temperatures of the second working fluids 100B at different positions in the second circulation path. For example, when a difference between the average temperature of the second working fluid 100B in the liquid heat exchanger 30 and the average temperature of the second working fluid 100B in the gas heat exchanger 40 exceeds a set value, it indicates that the heat exchange efficiency of the liquid heat exchanger 30 needs to be improved. In this case, the second fluid driving unit 80 increases the flow rate of the second working fluid 100B to improve heat exchange efficiency of the liquid heat exchanger 30. In some embodiments, the temperature of the second working fluid 100B which the second fluid driving unit 80 responds to may be a temperature of the second working fluid 100B at a certain position (for example, the liquid heat exchanger 30, the gas heat exchanger 40, or the second circulation pipe unit 90) in the second circulation path, an average temperature of the second circulation path, a temperature difference between the second working fluids 100B at different positions in the second circulation path, or any combination of the above. Thus, the second fluid driving unit 80 may adjust the flow rate based on the temperature of the second working fluid 100B. The heat exchange efficiency of the liquid heat exchanger 30 may be improved through increase of the flow rate, and energy-saving operation may be achieved through reduction of the flow rate.

Please refer to FIG. 1. In some embodiments, the second circulation module 2 further includes the gas transfer apparatus 50, which is arranged on the outside of the tank body 20. The gas heat exchanger 40 is arranged on the inlet side of the gas transfer apparatus 50. In some embodiments, the gas transfer apparatus 50 is configured to drive air outside the tank body 20 to flow. The air outside the tank body 20 is driven by the gas transfer apparatus 50 to flow toward the gas heat exchanger 40, that is, the air flowing direction is the +X axis direction shown in FIG. 1. In this way, the gas transfer apparatus 50 may increase the heat exchange efficiency of the gas heat exchanger 40.

Please refer to FIG. 1. In some embodiments, the gas transfer apparatus 50 drives the air to flow with an air mass flow rate in response to the temperature of the liquid heat exchanger 30. The air mass flow rate is a volume of air flowing the inlet side of the gas transfer apparatus 50 per unit time. That is, the air mass flow rate provided by the gas transfer apparatus 50 may be adjusted based on the temperature of the liquid heat exchanger 30. A relationship between the air mass flow rate provided by the gas transfer apparatus 50 and the temperature inside the accommodating structure 21 is represented by a formula (2).

$$\dot{m}_2 = Q_{out} / C_{p,air} (T_{air} - T_{f2}) \qquad \text{Formula (1)}$$

In the formula (2), $\dot{m}_2$ is the air mass flow rate provided by the gas transfer apparatus 50, $T_{air}$ is an average temperature of the air, $T_{f2}$ is the average temperature of the second working fluid 100B, $C_{p,air}$ is a specific heat capacity of the air, and $Q_{out}$ is a heat dissipation (in a unit of watt (W)) of the gas heat exchanger 40. $Q_{out}$ may be measured through the monitoring module of the immersion heat dissipation system having two circulations, or may be calculated through a heat calculation formula (a reference equation (2.1)) recorded by Shao-Wen Wu et al. in "Application of heat pipe exchanger in immersion cooling technology", Journal of Solar Energy and New Energy, Volume 23, Issue 2.

$$\dot{Q}_{heatdissipation} = \rho_{air} \overline{V}_{air,avg} A_{air,in} C_p (T_{air,out} - T_{air,in}) \qquad \text{Formula (2.1)}$$

In the formula (2.1), $\dot{Q}_{heatdissipation}$ is a heat dissipation capacity (W) of the heat pipe heat exchanger, $\overline{V}_{air,avg}$ is an average air speed (m/s) in a condensation region of the heat exchanger, $\rho_{air}$ is a density of the air, $T_{air,in}$ is an air inlet temperature (° C.), and $T_{air,out}$ is an air outlet temperature (° C.).

For example, in FIG. 1, the temperature of the liquid heat exchanger 30 becomes $T_3$ due to the heat absorption from the liquid in the accommodating structure 21. When the temperature $T_3$ exceeds a temperature upper limit, the gas transfer apparatus 50 increases the air mass flow rate, so that $\dot{m}_2$ in the formula (2) increases, and therefore $Q_{out}$ increases. That is, the gas heat exchanger 40 dissipates more heat into the air, so that the average temperature of the second working fluid 100B decreases, thereby improving the heat exchange efficiency of the liquid heat exchanger 30, which helps maintain the temperature in the accommodating structure 21 (or the average temperature of the first working fluid 100A) in a stable low temperature state. In some embodiments, the gas transfer apparatus 50 may reduce the air mass flow rate $\dot{m}_2$ in response to the temperature of the liquid heat exchanger 30 reaching a temperature lower limit. In some embodiments, the temperature of the liquid heat exchanger 30 may be an average temperature at a certain position of the liquid heat exchanger 30, the average temperature of the liquid heat exchanger 30, a temperature difference between different positions of the liquid heat exchanger 30, or any combination of the above. In some embodiments, the temperature of the liquid heat exchanger 30 may be substantially the same as the temperature of the second working fluid 100B in the liquid heat exchanger 30. Thus, the gas transfer apparatus 50 may adjust the air mass flow rate based on the temperature of the liquid heat exchanger 30. The heat exchange efficiency of the liquid heat exchanger 30 may be improved through increase of the air mass flow rate, and energy-saving operation may be achieved through reduction of the air mass flow rate.

In some embodiments, the immersion heat dissipation system having two circulations has a first active heat dissipation cycle and a second active heat dissipation cycle. In the first active heat dissipation cycle, the first fluid driving unit 60 may adjust the liquid mass flow rate of the first working fluid 100A. In the second active heat dissipation cycle, the gas transfer apparatus 50 may adjust the air mass flow rate of the air outside the tank body 20. Since the configuration of the immersion heat dissipation system having two circulations is consisting of the two active cooling cycles, the power usage effectiveness (PUE) thereof may be less than 1.2.

Figure 11:
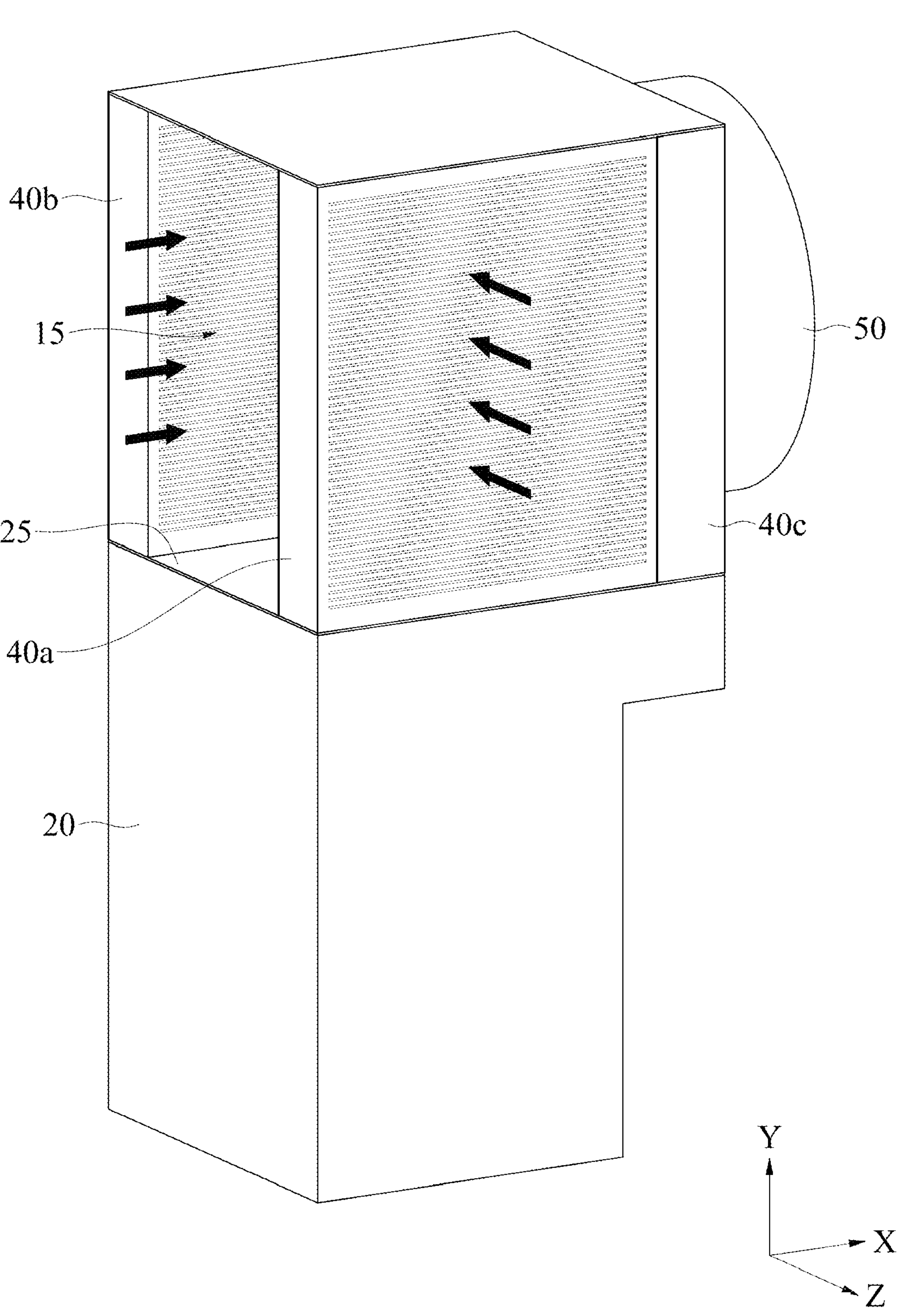
FIG. 11 illustrates a perspective view of the immersion heat dissipation system having two circulations according to some embodiments, showing a state in which an upper cover and a plurality of gas heat exchangers form a chamber and a gas transfer apparatus is arranged on a side of the gas heat exchangers, in which a flowing direction of air outside the tank body is represented by an arrow.
Figure 12:
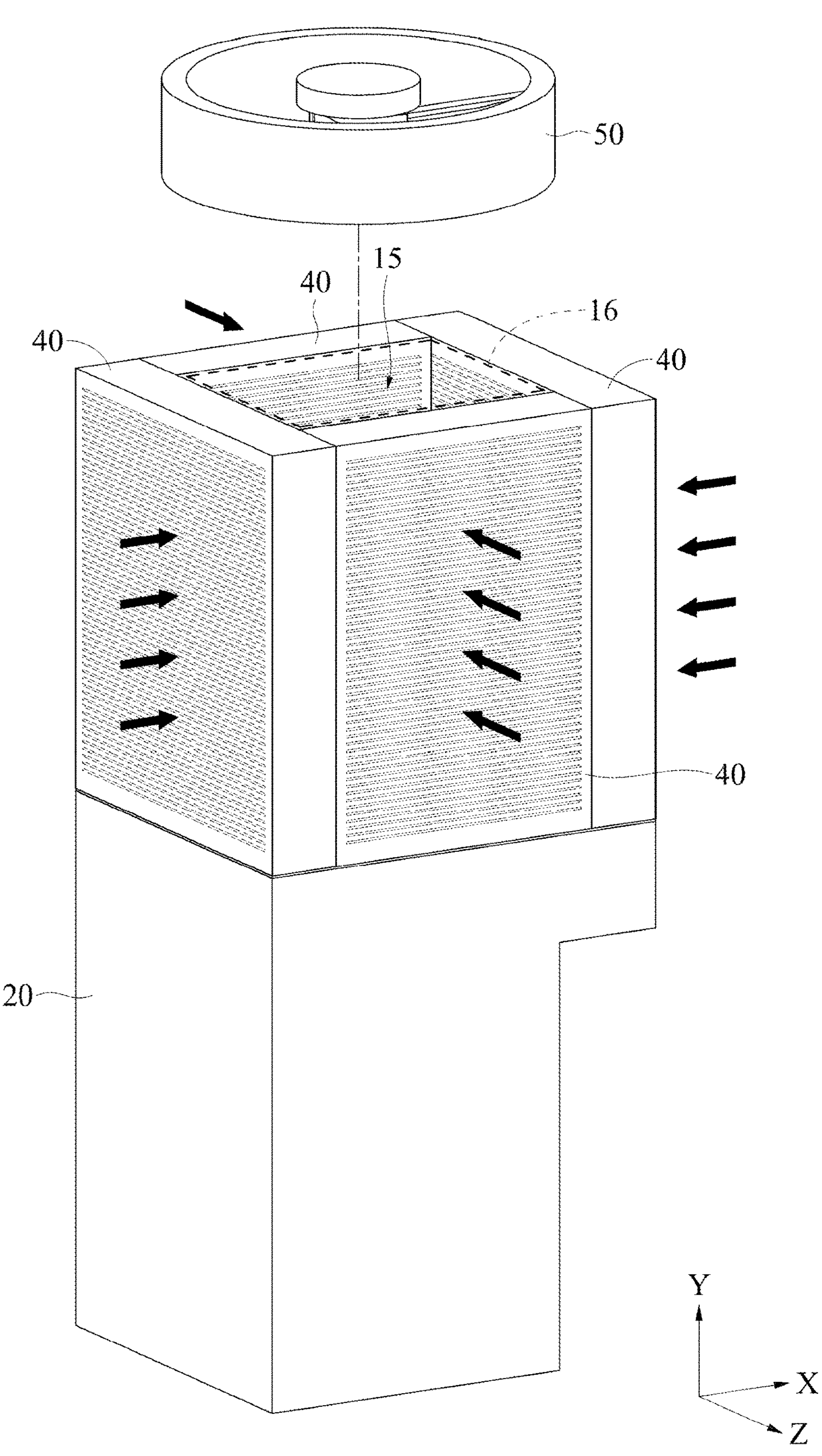
FIG. 12 illustrates a partial exploded view of the immersion heat dissipation system having two circulations according to some embodiments, showing a state in which the plurality of gas heat exchangers are arranged around an upper side of an upper cover; and the gas transfer apparatus is arranged above the gas heat exchangers, in which the flowing direction of the air outside the tank body is represented by an arrow, and an opening of the chamber is denoted by dashed lines.

Please refer to FIG. 11 and FIG. 12. FIG. 11 illustrates a perspective view of the immersion heat dissipation system having two circulations according to some embodiments, showing a state in which an upper cover 25 and a plurality of gas heat exchangers 40 form a chamber 15 and the gas transfer apparatus 50 is arranged on a side of the gas heat exchangers 40, in which a flowing direction of the air outside the tank body 20 is represented by an arrow. FIG. 12 illustrates a partial exploded view of the immersion heat dissipation system having two circulations according to some embodiments, showing a state in which the plurality of gas heat exchangers 40 are arranged around an upper side of an upper cover 25 and the gas transfer apparatus 50 is arranged above the gas heat exchangers 40, in which the flowing direction of the air outside the tank body 20 is represented by an arrow, and an opening 16 of the chamber 15 is denoted by dashed lines.

Please refer to FIG. 11. In some embodiments, a plurality of gas heat exchangers 40 may be arranged in the immersion heat dissipation system having two circulations, and the upper cover 25 and the gas heat exchangers 40 form the chamber 15. In FIG. 11, the gas heat exchangers 40*a*, 40*b*, and 40*c* are arranged on the upper side of the upper cover 25 and on the air inlet side of the gas transfer apparatus 50. The air outside the tank body 20 is driven by the gas transfer apparatus 50 to flow. The air flows from outside of the chamber 15 toward the gas transfer apparatus 50 through the gas heat exchangers 40*a*, 40*b*, and 40*c*. For example, the air flows through the gas heat exchanger 40*a* along the arrow of the −Z axis direction and into the chamber 15, and then flows toward the gas transfer apparatus 50 through the gas heat exchanger 40*c* along the arrow of +X axis direction. In FIG. 12, the plurality of gas heat exchangers 40 are arranged around the upper side of the upper cover 25 and form the chamber 15. The chamber has the opening 16 facing the +Y axis direction. The gas transfer apparatus 50 is arranged at the opening 16. In some embodiments, the gas transfer apparatus 50 may be, but not limited to, a fan. In this way, in some embodiments, the air outside the tank body 20 is driven by the gas transfer apparatus 50 to flow through the gas heat exchanger 40 along the arrow direction in FIG. 12 and into the chamber 15, and then flows out through the air outlet side of the gas transfer apparatus 50. In this way, the heat exchange area of gas heat exchangers 40 is increased, thereby improving the heat exchange efficiency of the first working fluid 100A in the accommodating structure 21.

In conclusion, according to some embodiments, the first circulation module and the second circulation module perform heat exchange on the air and the liquid through the circulation paths inside and outside of the tank body, thereby improving heat dissipation efficiency. In addition, according to some embodiments, the heat dissipation assembly may perform heat exchange on the air and the liquid, and thus the heat dissipation assembly has good heat exchange efficiency. In addition, the working fluid adapted for the heat dissipation assembly can flow in an independent circulation space, so that the risk of device damage due to leakage of the working fluid from the circulation space can be reduced. Thus, the heat dissipation assembly with has good reliability can be provided.

What is claimed is:

1. An immersion heat dissipation system having two circulations comprising:

a tank body comprising an accommodating structure, wherein the accommodating structure is adapted to accommodate an electronic device;

a first circulation module comprising a first circulation pipe unit and a first fluid driving unit, wherein the first circulation pipe unit is arranged on an outside of the tank body and in communication with the accommodating structure; the first fluid driving unit is connected to the first circulation pipe unit; and the accommodating structure comprises:

an extension portion, comprising an extended wall and an upper opening, wherein the upper opening is on the extended wall;

a bottom portion, in communication with the extension portion and having a lower opening, wherein the lower opening is on a side wall of the bottom portion; and the accommodating structure is in communication with the first circulation pipe unit through the upper opening and the lower opening; and a heat source portion, wherein the bottom portion is in communication with the extension portion through the heat source portion; a side wall of the heat source portion is connected to the side wall of the bottom portion and the extended wall to form an outer side portion; and the first circulation pipe unit and the first fluid driving unit are arranged in the outer side portion; and;

a second circulation module, outside of the tank body, wherein the second circulation module is configured to exchange heat between air outside the tank body and liquid in the accommodating structure.

2. The immersion heat dissipation system having two circulations according to claim 1, further comprising a second circulation pipe unit and a liquid heat exchanger, wherein the liquid heat exchanger is arranged in the accommodating structure;

the second circulation module comprises at least one air heat exchanger configured to perform heat exchange on the air outside the tank body;

the second circulation pipe unit is connected to the liquid heat exchanger and each of the at least one air heat exchanger; and the first circulation module and the second circulation module perform heat exchange through the liquid heat exchanger in the accommodating structure.

3. The immersion heat dissipation system having two circulations according to claim 2, wherein the second circulation module further comprises an air transfer apparatus; each of the at least one air heat exchanger is arranged on an air inlet side of the air transfer apparatus; and the air transfer apparatus is configured to drive the air to flow with an air mass flow rate in response to a temperature of the liquid heat exchanger.

4. The immersion heat dissipation system having two circulations according to claim 2, wherein each of the at least one air heat exchanger comprises a plurality of fins; the fins are parallel to each other and form an airflow channel, and the air flows along the airflow channel.

5. The immersion heat dissipation system having two circulations according to claim 2, further comprising a first working fluid in the accommodating structure, wherein the first fluid driving unit is configured to drive the first working fluid to flow toward the liquid heat exchanger; and the liquid heat exchanger is configured to perform heat exchange on the first working fluid.

6. The immersion heat dissipation system having two circulations according to claim 5, wherein the first fluid driving unit is configured to drive the first working fluid to flow with a liquid mass flow rate in response to a temperature of the first working fluid.

7. The immersion heat dissipation system having two circulations according to claim 5, wherein the liquid heat exchanger is arranged on the bottom portion; the liquid heat exchanger and a bottom plate of the bottom portion form a tank bottom portion; and the lower opening faces the tank bottom portion.

8. The immersion heat dissipation system having two circulations according to claim 5, wherein the liquid heat exchanger is arranged on the extension portion.

9. The immersion heat dissipation system having two circulations according to claim 5, wherein the first working fluid is configured to absorb heat of the electronic device as a stationary phase.

10. The immersion heat dissipation system having two circulations according to claim 2, further comprising a second working fluid, wherein the second circulation module further comprises a second fluid driving unit connected to the second circulation pipe unit; and the second fluid driving unit is configured to drive the second working fluid to flow toward the liquid heat exchanger.

11. The immersion heat dissipation system having two circulations according to claim 10, wherein the second fluid driving unit is configured to drive the second working fluid to flow with a flow rate in response to a temperature of the second working fluid.

12. The immersion heat dissipation system having two circulations according to claim 10, wherein the second circulation pipe unit comprises:

- a first immersed portion, connected to an outlet of the second fluid driving unit and an inlet portion of the liquid heat exchanger;
- a first turning portion, connected to an inlet of the second fluid driving unit and a cooling portion of each of the at least one air heat exchanger;
- a second immersed portion, connected to an outlet portion of the liquid heat exchanger; and
- a second turning portion, connected to the second immersed portion and a high-temperature portion of each of the at least one air heat exchanger.

13. The immersion heat dissipation system having two circulations according to claim 2, wherein the liquid heat exchanger comprises:

- a heat dissipation pipe unit, connected to the second circulation pipe unit; and
- a plurality of heat dissipation sheets, wherein the heat dissipation pipe unit is configured to pass through the heat dissipation sheets; and two adjacent ones of the heat dissipation sheets are substantially parallel to each other and form a splitting flow channel.

14. The immersion heat dissipation system having two circulations according to claim 1, further comprising a second circulation pipe unit, a liquid heat exchanger, a first working fluid, and a second working fluid, wherein

- the liquid heat exchanger and the first working fluid are in the accommodating structure; and the first circulation module and the second circulation module perform heat exchange through the liquid heat exchanger in the accommodating structure;
- the first circulation module further comprises a first fluid driving unit connected to the first circulation pipe unit; the first fluid driving unit is configured to drive the first working fluid to flow toward the liquid heat exchanger; and the liquid heat exchanger is configured to perform heat exchange on the first working fluid;
- the first working fluid is configured to absorb heat of the electronic device as a stationary phase;
- the first fluid driving unit is configured to drive the first working fluid to flow with a liquid mass flow rate in response to a temperature of the first working fluid;
- the second circulation module comprises a air heat exchanger, a second fluid driving unit, and a air transfer apparatus; the air heat exchanger is configured to perform heat exchange on the air outside the tank body; the second fluid driving unit is connected to the second circulation pipe unit, is configured to drive the second working fluid to flow toward the liquid heat exchanger, and is configured to drive the second working fluid to flow with a flow rate in response to a temperature of the second working fluid; the air heat exchanger is arranged on an air inlet side of the air transfer apparatus, and the air transfer apparatus is configured to drive the air to flow with an air mass flow rate in response to a temperature of the liquid heat exchanger;
- the second circulation pipe unit is connected to the liquid heat exchanger and the air heat exchanger; and the second working fluid is flowed in the liquid heat exchanger, the air heat exchanger, and the second circulation pipe unit.

15. The immersion heat dissipation system having two circulations according to claim 1, further comprising a second circulation pipe unit and a liquid heat exchanger, wherein

- the liquid heat exchanger is in the accommodating structure; and the first circulation module and the second circulation module perform heat exchange through the liquid heat exchanger in the accommodating structure;
- the first circulation module further comprises a first fluid driving unit connected to the first circulation pipe unit;
- the second circulation module comprises a air heat exchanger, a second fluid driving unit, and a air transfer apparatus; the air heat exchanger is configured to perform heat exchange on the air outside the tank body; the air heat exchanger is arranged on an air inlet side of the air transfer apparatus; the air heat exchanger comprises a plurality of fins, the fins are parallel to each other and form an airflow channel, and the air flows along the airflow channel; and
- the second circulation pipe unit comprises:
  - a first immersed portion, connected to an inlet portion of the liquid heat exchanger and an outlet of the second fluid driving unit;
  - a first turning portion, connected to an inlet of the second fluid driving unit and a cooling portion of the air heat exchanger;
  - a second immersed portion, connected to an outlet portion of the liquid heat exchanger; and
  - a second turning portion, connected to the second immersed portion and a high-temperature portion of the air heat exchanger.

16. The immersion heat dissipation system having two circulations according to claim 1, further comprising a second circulation pipe unit and a liquid heat exchanger, wherein

- the liquid heat exchanger is arranged in the accommodating structure; and the first circulation module and the second circulation module perform heat exchange through the liquid heat exchanger in the accommodating structure;
- the liquid heat exchanger comprises:
  - a heat dissipation pipe unit, connected to the second circulation pipe unit; and
  - a plurality of heat dissipation sheets, wherein the heat dissipation pipe unit is configured to pass through the heat dissipation sheets; and the two adjacent heat dissipation sheets are substantially parallel to each other and form a splitting flow channel;

the first circulation module further comprises a first fluid driving unit connected to the first circulation pipe unit;

the second circulation module comprises a air heat exchanger configured to perform heat exchange on the air outside the tank body, and the second circulation pipe unit is connected to the liquid heat exchanger and the air heat exchanger;

the liquid heat exchanger is arranged on the bottom portion; the liquid heat exchanger and a bottom plate of the bottom portion form a tank bottom portion; and the lower opening faces the tank bottom portion.

17. An immersion heat dissipation system having two circulations, comprising:

a tank body comprising an accommodating structure and an upper cover, wherein the accommodating structure is adapted to accommodate an electronic device; and the upper cover is pivotally connected to the accommodating structure;

a first circulation module comprising a first circulation pipe unit, wherein the first circulation pipe unit is arranged on an outside of the tank body and in communication with the accommodating structure;

a second circulation module, outside of the tank body, wherein the second circulation module is configured to exchange heat between air outside the tank body and liquid in the accommodating structure; and the second circulation module comprises at least one air heat exchanger configured to perform heat exchange on the air outside the tank body;

a liquid heat exchanger, arranged in the accommodating structure; and a second circulation pipe unit, connected to the liquid heat exchanger and each of the at least one air heat exchanger;

wherein the first circulation module and the second circulation module perform heat exchange through the liquid heat exchanger in the accommodating structure;

the number of the at least one air heat exchanger is plural; and the upper cover and the air heat exchangers form a chamber.

* * * * *